US012666948B2

(12) United States Patent
Hua et al.

(10) Patent No.: US 12,666,948 B2
(45) Date of Patent: Jun. 23, 2026

(54) DISPLAY PANEL AND DISPLAY DEVICE

(71) Applicant: Xiamen Tianma Display Technology Co., Ltd., Xiamen (CN)

(72) Inventors: Huomei Hua, Xiamen (CN); Landi Li, Xiamen (CN); Huangyao Wu, Xiamen (CN); Sai Zhang, Xiamen (CN)

(73) Assignee: Xiamen Tianma Display Technology Co., Ltd., Xiaman (CN)

( * ) Notice: Subject to any disclaimer, the term of this patent is extended or adjusted under 35 U.S.C. 154(b) by 514 days.

(21) Appl. No.: 18/127,779

(22) Filed: Mar. 29, 2023

(65) Prior Publication Data

US 2023/0238326 A1     Jul. 27, 2023

(30) Foreign Application Priority Data

Dec. 12, 2022   (CN) .......................... 202211598672.8

(51) Int. Cl.
| | |
|---|---|
| *H10K 59/131* | (2023.01) |
| *G09F 9/30* | (2006.01) |
| *G09G 3/20* | (2006.01) |
| *H10W 20/41* | (2026.01) |

(52) U.S. Cl.
CPC ................................ *H10W 20/427* (2026.01)

(58) Field of Classification Search
CPC .... H01L 23/5286; H10K 59/131; G09G 3/20; G09G 2300/0426; G09G 2320/0223; G09G 2320/0233; Y02D 10/00; G09F 9/30
See application file for complete search history.

(56) References Cited

U.S. PATENT DOCUMENTS

2018/0239476 A1*   8/2018   Yoshida ................ G06F 3/0443

FOREIGN PATENT DOCUMENTS

| | | | | |
|---|---|---|---|---|
| CN | 109713022 A | | 5/2019 | |
| CN | 110718577 A | | 1/2020 | |
| CN | 215578564 U | * | 1/2022 | ............. H10D 86/00 |
| CN | 115172428 A | * | 10/2022 | ........... H10K 59/131 |

OTHER PUBLICATIONS

Translation Relied on for Chinese Patent—CN 115172428 A (Year: 2022).*
Translation Relied on for Chinese Patent—CN 215578564 U (Year: 2022).*

* cited by examiner

*Primary Examiner* — Dale E Page
*Assistant Examiner* — Daniel J Hibbert
(74) *Attorney, Agent, or Firm* — KDW FIRM PLLC

(57)     ABSTRACT

Provided are a display panel and a display device. The display panel includes a display region and a non-display region. The display region includes multiple first power signal lines, and the multiple first power signal lines extend along a first direction. The non-display region includes a power bus and a power lead-out wire. The power bus includes a first bus section and a second bus section, and along the first direction, the first bus section is connected to the power lead-out wire. The display region includes a first display region and a second display region, along the first direction, an overlapping region exists between a projection of the first display region on the power bus and the first bus section, an overlapping region exists between a projection of the second display region on the power bus and the second bus section.

20 Claims, 12 Drawing Sheets

10

10

B

B

B

10

10

1

10

DISPLAY PANEL AND DISPLAY DEVICE

CROSS-REFERENCE TO RELATED APPLICATION(S)

This application claims priority to Chinese Patent Application No. 202211598672.8 filed Dec. 12, 2022, the disclosure of which is incorporated herein by reference in its entirety.

TECHNICAL FIELD

Embodiments of the present disclosure relate to the field of display technology and, in particular, to a display panel and a display device.

BACKGROUND

With the development of display technology, display panels are widely used in products such as mobile phones, computers, tablets, e-readers, etc. In addition, display panels can also be used in instrument displays and smart home control panels.

In an existing display panel, signal transmission loss is different on wires at different positions, which leads to unstable signal transmission in the display panel and thus impacts the display effect of the display panel.

SUMMARY

Embodiments of the present disclosure provide a display panel and a display device. The number of power signal lines in different display regions for the connection with a bus is adjusted, so that the display uniformity of the display panel is ensured.

In a first aspect, an embodiment of the present disclosure provides a display panel. The display panel includes a display region and a non-display region, and the non-display region is located on at least a side of the display region.

The display region includes multiple first power signal lines, the multiple first power signal lines extend along a first direction, the multiple first power signal lines are arranged along a second direction, and the first direction and the second direction intersect.

The non-display region includes a power bus and a power lead-out wire, and the power lead-out wire is disposed in series between the power bus and a power signal terminal.

The power bus includes a first bus section and a second bus section, and along the first direction, the first bus section is connected to the power lead-out wire.

The display region includes a first display region and a second display region, along the first direction, an overlapping region exists between a projection of the first display region on the power bus and the first bus section, an overlapping region exists between a projection of the second display region on the power bus and the second bus section, first power signal lines of the multiple first power signal lines which are located in the first display region are not electrically connected to the first bus section or partially electrically connected to the first bus section, and first power signal lines of the multiple first power signal lines which are located in the second display region are at least partially electrically connected to the second bus section.

In a second aspect, an embodiment of the present disclosure provides a display device. The display device includes the display panel described in the first aspect.

BRIEF DESCRIPTION OF DRAWINGS

In order to illustrate technical solutions in example embodiments of the present disclosure more clearly, a brief introduction to drawings required in the description of the embodiments will be given below. Apparently, the introduced drawings are merely part, not all, of drawings of the embodiments of the present disclosure to be described, and those of ordinary skill in the art may obtain other drawings based on the drawings described below on the premise that no creative work is done.

DETAILED DESCRIPTION

Figure 1:
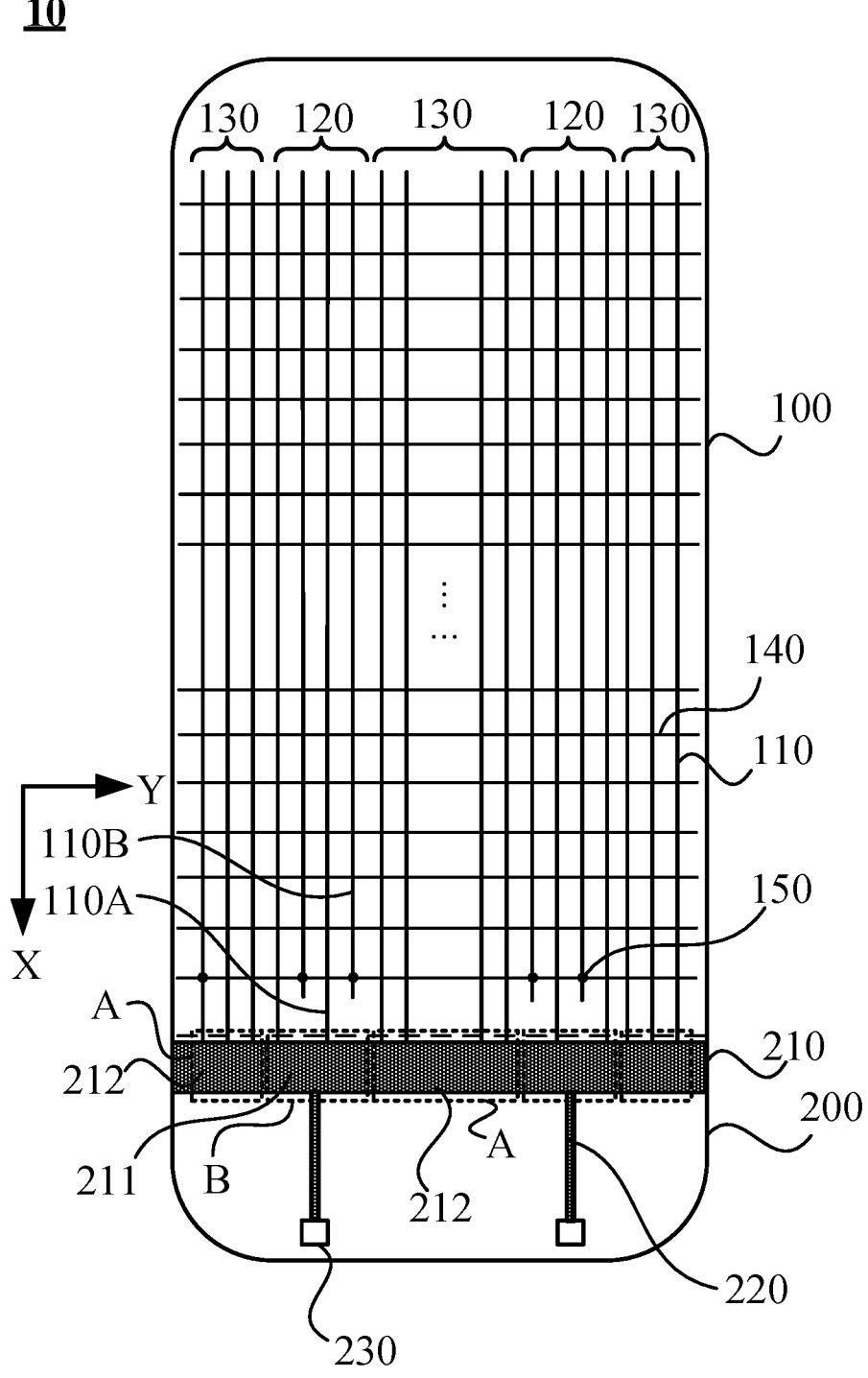
FIG. 1 is a structural diagram of a display panel according to an embodiment of the present disclosure.

Hereinafter the present disclosure is further described in detail in conjunction with the drawings and embodiments. It is to be understood that the specific embodiments described herein are only intended to illustrate but not to limit the present disclosure. Additionally, it is to be noted that, for ease of description, only part, not all, of structures related to the present disclosure are illustrated in the drawings.

It is to be noted that the terms "first", "second" and the like in the description, claims and drawings of the present disclosure are used for distinguishing between similar objects and are not necessarily used for describing a particular order or sequence. It should be understood that the data used in this manner is interchangeable in appropriate cases so that the embodiments of the present disclosure described here can be implemented in an order not illustrated or described here. In addition, terms "comprising", "including" and any other variations thereof are intended to encompass a non-exclusive inclusion. For example, a system, product or device that includes a series of units not only includes the expressly listed steps or units but may also include other units that are not expressly listed or are inherent to such a product or device.

Figure 2:
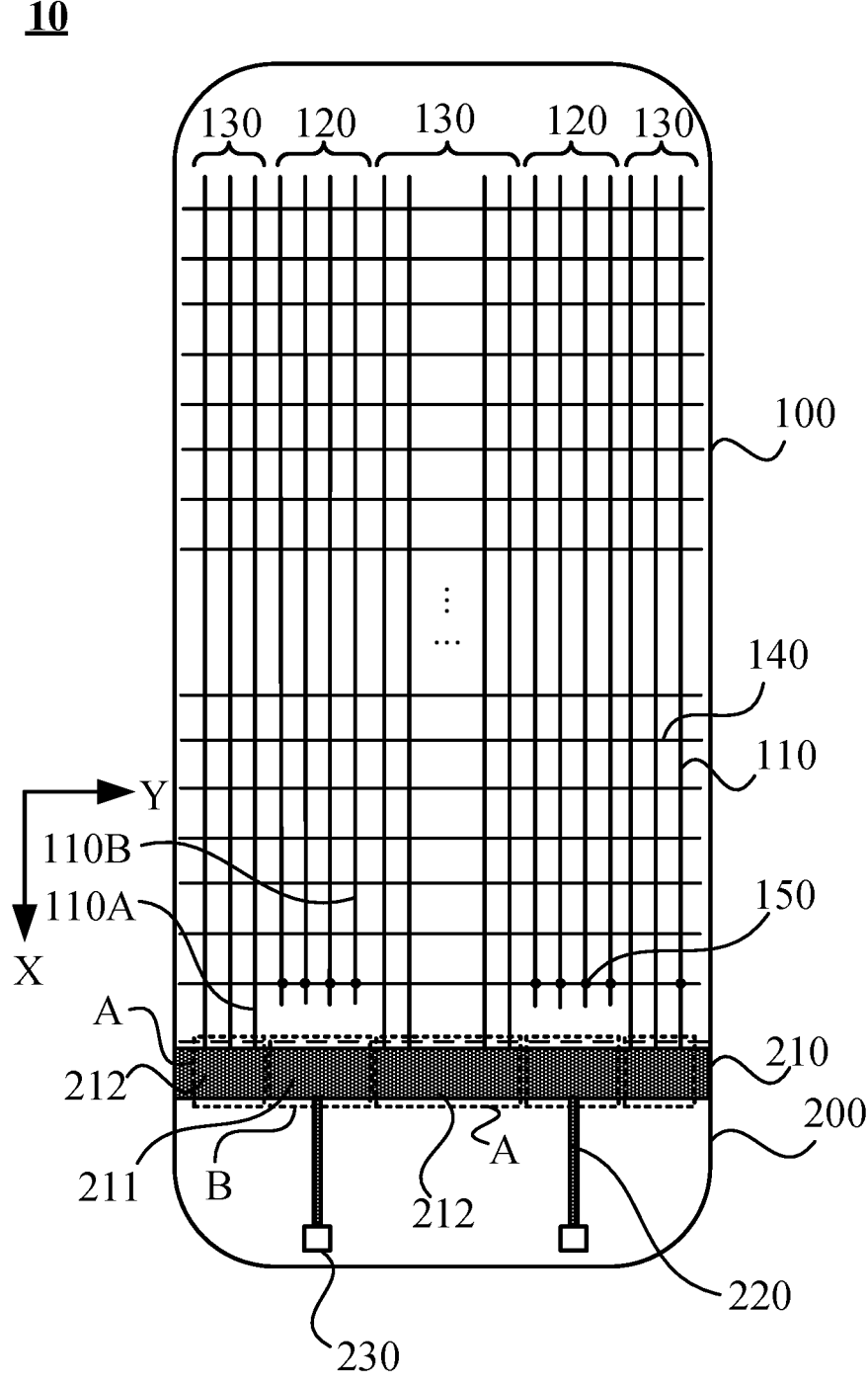
FIG. 2 is a structural diagram of another display panel according to an embodiment of the present disclosure.

FIG. 1 is a structural diagram of a display panel according to an embodiment of the present disclosure, and FIG. 2 is a structural diagram of another display panel according to an embodiment of the present disclosure. Referring to FIG. 1 and FIG. 2, an embodiment of the present disclosure provides a display panel 10. The display panel 10 includes a display region 100 and a non-display region 200, and the non-display region 200 is located on at least a side of the display region 100. The display region 100 includes multiple first power signal lines 110, the multiple first power signal lines 110 extend along a first direction X, the multiple first power signal lines 110 are arranged along a second direction Y, and the first direction X and the second direction Y intersect. The non-display region 200 includes a power bus 210 and power lead-out wires 220, and a power lead-out wire 220 is disposed in series between the power bus 210 and a power signal terminal 230. The power bus 210 includes first bus sections 211 and second bus sections 212, and along the first direction X, a first bus section 211 is connected to a power lead-out wire 220. The display region 100 includes first display regions 120 and second display regions 130, along the first direction X, an overlapping region exists between a projection of a first display region 120 on the power bus 210 and a first bus section 211, an overlapping region exists between a projection of a second display region 130 on the power bus 210 and a second bus section 212, first power signal lines 110 which are located in a first display region 120 are not electrically connected to a first bus section 211 or partially electrically connected to a first bus section 211, and first power signal lines 110 which are located in a second display region 130 are at least partially electrically connected to a second bus section 212.

The display panel 10 includes the display region 100 and the non-display region 200, the non-display region 200 may be a border region located on a side of the display region 100, and the position relationship between the display region 110 and the non-display region 120 is not specifically limited in the embodiment of the present disclosure. The display region 100 is used for implementing the display function of the display panel 10, and the non-display region 200 is used for disposing drive units or the like for driving the display region 100 to implement the display function.

Further, referring to FIG. 1 and FIG. 2, the display region 100 includes the first power signal lines 110. The first power signal lines 110 are used for transmitting power signals and provide the power signals to subpixels for achieving light emission display in the display region 100, so as to ensure the display effect of the display panel 10. Specifically, multiple first power signal lines 110 are disposed in the display region 100, the multiple first power signal lines 110 extend along the first direction X, and the multiple first power signal lines 110 are arranged along second direction Y. The first direction X is a direction from which the display region 100 points to the non-display region 200. In the display region 100, the first power signal lines 110 are regularly arranged in an even array, so that the balanced display effect of the display region 100 is achieved.

Further, the non-display region 200 includes the power bus 210, the power lead-out wires 220 and power signal terminals 230. The power signal terminal 230 is electrically connected to the power lead-out wire 220, the power lead-out wire 220 is then electrically connected to the power bus 210, and the power bus 210 is electrically connected to the first power signal lines 110. Therefore, a power signal (PVDD) transmitted by the power signal terminal 230 can be spread and transmitted to the power bus 210, so that the multiple first power signal lines 110 in the display region 100 acquire the power signal, and thus the display function of the display panel 10 is achieved. The power signal terminal 230 may be a connection terminal such as a metal pad for being bound and electrically connected to a power signal output terminal in a flexible printed circuit and then receiving a power signal transmitted by the flexible printed circuit.

Further, the power bus 210 includes the first bus sections 211 and the second bus sections 212. Referring to FIG. 1 and FIG. 2, along the first direction X, that is, along the direction from which the display region 100 points to the non-display region 200, the first bus section 211 is connected to the power lead-out wire 220, and the second bus section 212 is not connected to the power lead-out wire 220. The power signal output by the power signal terminal 230 is first directly transmitted to the first bus section 211, and then transmitted to the second bus section 212 through the first bus section 211, that is, the first bus section 211 is closer to the power lead-out wire 220 than the second bus section 212; therefore, the first bus section 211 receives the power signal earlier than the second bus section 212, and thus the first bus section 211 is an outputting section of the power signal in the second bus section 212.

It is to be noted that the case where the first bus section 211 is connected to the power lead-out wire 220 may be that the first bus section 211 and the power lead-out wire 220 are disposed in the same layer and directly connected, or may be that the first bus section 211 and the power lead-out wire 220 are disposed in different layers and electrically connected through a connection via hole, which is not limited in the embodiment of the present disclosure.

Further, referring to FIG. 1 and FIG. 2, the display region 100 includes the first display regions 120 and the second display regions 130. Along the first direction X, that is, along the direction from which the display region 110 points to the non-display region 200, at the power bus 210, an overlapping region exists between the projection of the first display region 120 and the first bus section 211, that is, there is at least one straight line extending along the first direction X and passing the first display region 120 and the first bus section 211 simultaneously; an overlapping region exists between the projection of the second display region 130 and the second bus section 212, that is, there is at least one straight line extending along the first direction X and passing the second display region 130 and the second bus section 212 simultaneously. As described above, since the first bus section 211 in region B is connected to the power lead-out wire 220, the loss of the power signal transmitted in the first bus section 211 is less than the loss of the power signal transmitted in the second bus section 212. The first bus section 211 and the second bus section 212 are disposed at different positions, that is, the first bus section 211 and the second bus section 212 have different relative distances from the power lead-out wire 220, so that the resulting power signal loss is different, which may lead to a difference in power signals transmitted to the first power signal lines 110, and thereby impact the display balance of the display panel 10.

Specifically, the first power signal lines 110 which are located in the first display region 120 are electrically connected to the first bus section 211 or partially electrically connected to the first bus section 211, that is, referring to FIG. 1, the case may exist where part of the first power signal lines 110 in the first display region 120 are electrically connected to the first bus section 211, and the other part of the first power signal lines 110 in the first display region 120 are not connected to the first bus section 211, that is, are insulated from the first bus section 211; or referring to FIG. 2, the case may exist where all of the first power signal lines 110 in the first display region 120 are not connected to the first bus section 211, that is, are insulated from the first bus section 211. The first power signal lines 110 which are located in the second display region 130 are at least partially electrically connected to the second bus section 212, that is, referring to FIG. 1 and FIG. 2, the case may exist where the first power signal lines 110 in the second display region 130 are all electrically connected to the second bus section 212; or the case (not specifically shown in the figures) may exist where part of the first power signal lines 110 in the second display region 130 are insulated from the second bust section 212. In other words, the position of the first bus section 211 relative to the power lead-out wire 220 is different from the position of the second bus section 212 relative to the power lead-out wire 220, and the second bus section 212 is further away from the power lead-out wire, so that a relatively large amount of power loss is generated, that is, the voltage generated at the first bus section 211 is higher than the voltage generated at the second bus segment 212. The first bus section 211 is insulated from part of the first power signal lines 110 and is not electrically connected to all of the first power signal lines 110, so that at least part of the first power signal lines 110 receive the power signal transmitted by other transmission channels. In this manner, the loss on the first power signal lines 110 in the first display region 120 is increased, the voltage strength of the power signal on the first power signal lines 110 in the first display region 120 is reduced, and the power signal strength in the first display region 120 and the power signal strength in the second display region 130 are balanced; therefore the balance of the power signals acquired by the first power signal lines 110 in the display region 100 is ensured, and thus the overall display balance of the display panel 10 is ensured.

It is to be noted that for the first power signal lines 110 which are located in the first display region 120, at least part of the first power signal lines 110 which are not directly electrically connected to the first bus section 211 may access the power signal in other manners, and the loss of the power signal which is accessed by the at least part of the first power signal lines 110 which are not directly electrically connected to the first bus section 211 is larger than the loss of the power signal which is accessed by the at most part of the first power signal lines 110 which are directly electrically connected to the first bus section 211, so that the loss on the first power signal lines 110 in the first display region 120 is increased, and thus the power signal in the first display region 120 and the power signal in the second display region 130 are balanced; therefore, the balance of the power signals acquired by the first power signal lines 110 in the display region 100 is ensured, so that the overall display balance of the display panel 10 is ensured. It is further to be noted that FIG. 1 illustrates the example that the display panel includes two power lead-out wires 220, correspondingly, the power bus 210 includes two first bus sections 211, and the display region 100 includes two first display regions 120. The embodiment of the present disclosure does not limit the number of power lead-out wires, and in other embodiments, one, three or more power lead-out wires may be provided. Corresponding to the number of power lead-out wires, one, three or more first bus sections and one, three or more first display regions may be provided. Moreover, the embodiment of the present disclosure does not limit the number of power signal lines in the first display region and the number of power signal lines in the second display region. The number of power signal lines may be related to the display resolution of the display panel; for example, each power signal line corresponds to a column of subpixels.

In summary, for the display panel provided in the embodiment of the present disclosure, the first power signal lines located in the first display region are not electrically connected to the first bus section or partially electrically connected to the first bus section, and the first power signal lines located in the second display region are at least partially electrically connected to the second bus section. That is, the number of the power signal lines and the form of the connection between the power signal lines and the bus in different display regions are adjusted, so that the display uniformity of the display panel is ensured, and the display effect of the display panel is improved.

With continued reference to FIG. 1, among the multiple first power signal lines 110 located in the first display region 120, part of the multiple first power signal lines 110 are electrically connected to the first bus section 211.

Referring to region B in FIG. 1, the first bus section 211 is electrically connected to part of the first power signal lines 110, and the first bus section 211 is not electrically connected to the other part of the first power signal lines 110. Specifically, the power signal output by the power signal terminal 230 is first directly transmitted to the first bus section 211, then transmitted to the second bus section 212 through the first bus section 211, and then transmitted to the first power signal lines 110 through the first bus section 211 and the second bus section 212, respectively. Not all of the first power signal lines 110 in the first display region 120 are electrically connected to the first bus section 211, that is, not all of the first power signal lines 110 in the first display region 120 receive a power signal with a relatively small loss, and at least part of the first power signal lines 110 in the first display region 120 receive the power signal transmitted from other transmission channels. In this manner, the transmission loss of the power signal in the first display region is increased, so that the voltage strength of the power signal in the first display region 120 is reduced; therefore, the balance of the power signals acquired by the first power signal lines 110 in the entire display region 100 is ensured, and thus the overall display balance of the display panel 10 is ensured.

Figure 3:
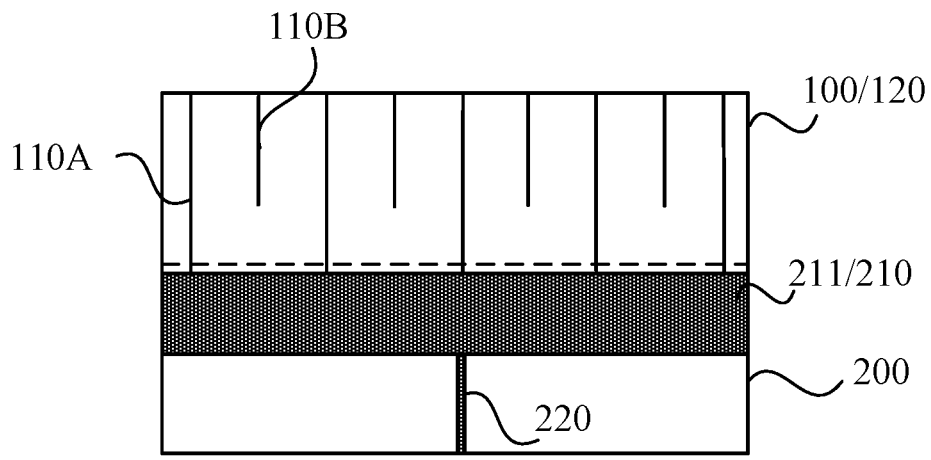
FIG. 3 is an enlarged diagram of region B in FIG. 1.

FIG. 3 is an enlarged diagram of region B in FIG. 1. Referring to FIG. 1 and FIG. 3, the multiple first power signal lines 110 located in the first display region 120 include first power signal sublines 110A electrically connected to the first bus section 211 and second power signal sublines 110B insulated from the first bus section 211. The number of second power signal sublines 110B between any two adjacent first power signal sublines 110A is the same.

Specifically, referring to FIG. 1 and FIG. 3, FIG. 3 represents an enlarged diagram of region B in FIG. 1. The first power signal lines 110 include the first power signal sublines 110A and the second power signal sublines 110B. The first power signal sublines 110A are electrically connected to the first bust section 211, and the second power signal sublines 110B are insulated from the first bus section 211. That is, the second power signal sublines 110B are insulated from the first bus section 211, so that among the multiple first power signal lines 110 located in the first display region 120, part of the multiple first power signal lines 110 are electrically connected to the first bus section 211. That is, the first power signal sublines 110 can acquire the power signal through the first bus section 211, and the second power signal sublines 110 can acquire the power signal transmitted from other transmission channels, so that the transmission loss of the power signal in the first display region 120 is increased, thus the voltage strength of the power signal in the first display region 120 is reduced, and the overall display balance of the display region 100 of the display panel 10 is ensured.

Further, the number of second power signal sublines 110B between any two adjacent first power signal sublines 110A is the same, so that the manner for disposing second power signal sublines 110B between first power signal sublines 110A is ensured to be simple, the strength distribution of the power signals in the first display region 120 is balanced, and thus the overall display of the first display region 120 is ensured to be balanced. Exemplarily, referring to FIG. 3, one second power signal subline 110B may be included between any two adjacent first power signal sublines 110A, and the arrangement that one second power signal subline 110B is included between any two adjacent first power signal sublines 110A is periodic. FIG. 3 is only an example, actually, multiple manners may be used for disposing second power signal sublines 110B between first power signal sublines 110A, and the embodiment of the present disclosure does not specifically limit the number of the first power signal sublines 110A and the number of the second power signal sublines 110B.

Figure 4:
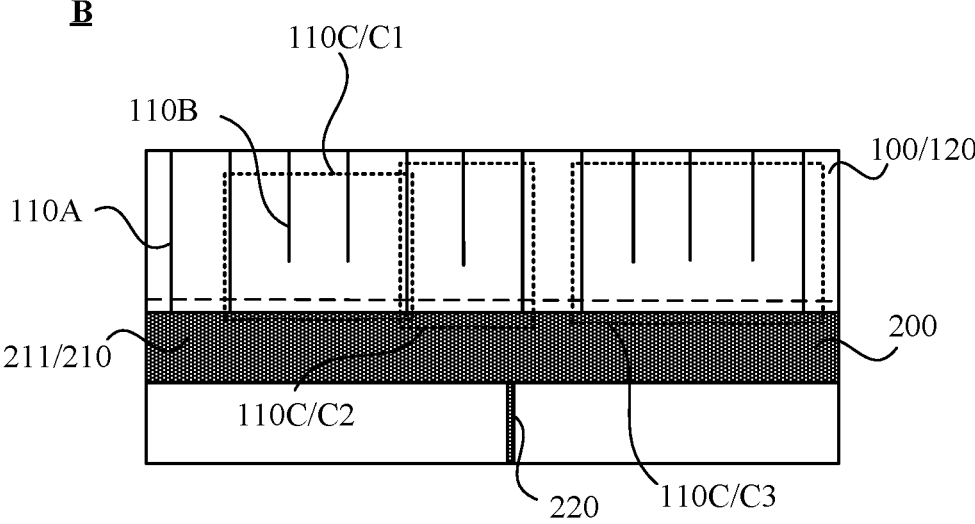
FIG. 4 is another enlarged diagram of region B in FIG. 1.

FIG. 4 is another enlarged diagram of region B in FIG. 1. Referring to FIG. 1 and FIG. 4, the multiple first power signal lines 110 located in the first display region 120 includes the first power signal sublines 110A electrically connected to the first bus section 211 and the second power signal sublines 110B insulated from the first bus section 211. Two adjacent first power signal sublines 110A and a second power signal subline 110B between the two adjacent first power signal sublines 110A form a first power signal line group 110C. Two first power signal line groups 110C have different numbers of second power signal sublines 110B.

The first display region 120 includes multiple first power signal line groups 110C, and a first power signal line group 110C includes two adjacent first power signal sublines 110A and a second power signal subline 110B between the two adjacent first power signal sublines 110A. Referring to FIG. 4, numbers of second power signal sublines 110B in different first power signal line groups 110C are diverse, that is, first power signal line groups 110C are diverse. In this manner, the regular arrangement of the first power signal lines 110 is broken, regular bright and dark stripes in the display region 100 are avoided, and thus the overall display effect of the display panel 10 is ensured.

Exemplarily, referring to FIG. 4, multiple first power signal line groups 110C, that is, the first power signal line group 110C located in region C1, the first power signal line group 110C located in region C2 and the first power signal line group 110C located in region C3, are taken as an example for illustration in the figure. The first power signal line group 110C in region C1 includes two adjacent first power signal sublines 110A and two second power signal sublines 110B between the two adjacent first power signal sublines 110A; the first power signal line group 110C in region C2 includes two adjacent first power signal sublines 110A and one second power signal subline 110B between the two adjacent first power signal sublines 110A; and the first power signal line group 110C in region C3 includes two adjacent first power signal sublines 110A and three second power signal sublines 110B between the two adjacent first power signal sublines 110A. The embodiment of the present disclosure merely shows that two first power signal line groups 110C have different numbers of second power signal sublines 110B, but does not limit the specific number of second power signal sublines 110B.

Figure 5:
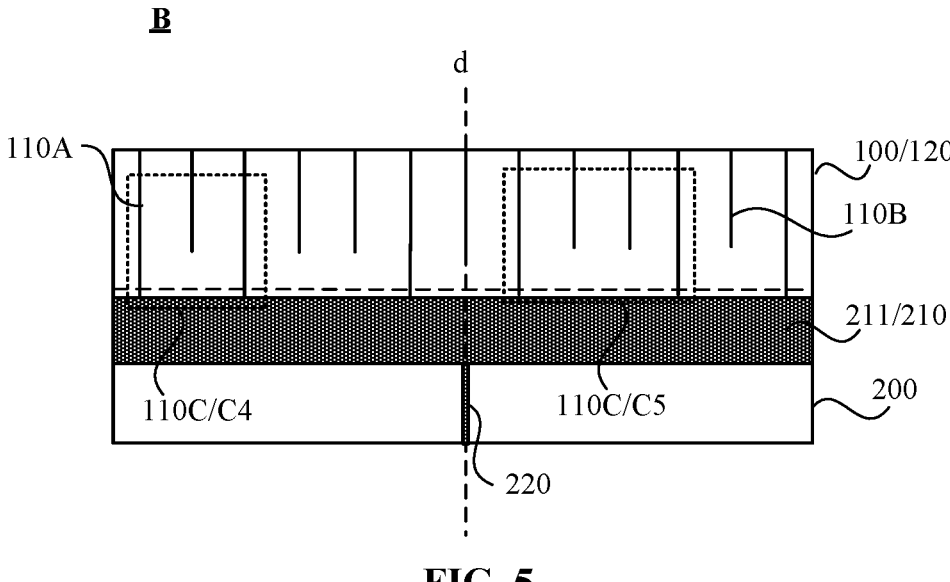
FIG. 5 is another enlarged diagram of region B in FIG. 1.

FIG. 5 is another enlarged diagram of region B in FIG. 1. Referring to FIG. 1 and FIG. 5, in any two first power signal line groups 110C, the number of second power signal sublines 110B in a first power signal line group 110C of the any two first power signal line groups 110C which is close to a center d side of the first display region 120 is a first number, and the number of second power signal sublines 110B in a first power signal line group 110C of the any two first power signal line groups 110C which is away from the center d side of the first display region 120 is a second number. The second number is smaller than the first number, and the center d of the first display region 120 extends along the first direction X and coincides with a center of the power lead-out wire 220.

Specifically, referring to FIG. 5, the first display region 120 includes the center d, and the extension line where the center d of the first display region 120 is located coincides with the power lead-out wire 220, that is, the center of the first display region 120 is closest to the power lead-out wire 220. Further, the first display region 120 includes multiple first power signal line groups 110C, that is, there are a first power signal line group 110C (region C5 in FIG. 5) close to the center d side of the first display region 120 and a first power signal line group 110C (region C4 in FIG. 5) away from the center d side of the first display region 120.

In FIG. 5, the number of second power signal sublines 110B in the first power signal line group 110C corresponding to region C4 is different from the number of second power signal sublines 110B in the first power signal line group 110C corresponding to region C5. Specifically, the number of second power signal sublines 110B in the first power signal line group 110C close to the center d of the first display region 120 is greater than the number of second power signal sublines 110B in the first power signal line group 110C away from the center d of the first display region 120, that is, a gradual transition trend exists that in the first display region 120, the number of second power signal sublines 110B close to the center d is greater and the number of second power signal sublines 110B away from the center d is smaller. Further, in the case where the number of second power signal sublines 110B in the second display region 130 is smaller than the number of second power signal sublines 110B in the first display region 120, the arrangement of the second power signal sublines 110B in the first display region 120 is designed to be more refined, so as to ensure that the transition between the first display region 120 and the second display region 130 is more stable, avoid the obvious brightness difference of the display panel 10, and improve the overall balanced display effect of the display panel 10.

With continued reference to FIG. 2, the multiple first power signal lines 110 located in the first display region 120 are all insulated from the first bus section 211.

Referring to region B in FIG. 2, the first bus section 211 is insulated from all of the first power signal lines 110, that is, the first power signal lines 110 in region B are all second power signal sublines 110B. At this time, none of the power signals acquired by the first power signal lines 110 in the first display region 120 is directly transmitted through the first bus section 211.

Further, the first power signal lines 110 in the first display region 120 are all set as second power signal sublines 110B, so that the voltage strength of the power signal transmitted through the first power signal lines 110 in the first display region 120 is reduced, the voltage strength of the power signal in the first display region 120 and the voltage strength of the power signal in the second display region 130 are balanced, the balance of the power signals acquired by the first power signal lines 110 in the entire display region 100 is ensured, and thus the overall display balance of the display panel 10 is ensured. Moreover, the connection process of the first power signal lines 110 in the first display region 120 and the first bus section 211 can also be simplified, and thus the overall manufacturing process and manufacturing cost of the display panel 10 are simplified.

With continued reference to FIG. 1 and FIG. 2, the display region 100 further includes multiple second power signal lines 140. The multiple second power signal lines 140 extend along the second direction Y, and the multiple second power signal lines 140 are arranged along the first direction X. The first power signal lines 110 and the second power signal lines 140 are disposed in different layers, and at least one second power signal line 140 is electrically connected through via holes 150 to multiple first power signal lines 110 arranged along the second direction Y. A first power signal line 110 which is insulated from the first bus section 211 is electrically connected through a via hole 150 to a second power signal line 140.

Specifically, the display region 100 includes multiple first power signal lines 110 and multiple second power signal lines 140. The first power signal lines 110 extend along the first direction X, the second power signal lines 140 extend along the second direction Y, the first power signal lines 110 are arranged along the second direction Y, and the second power signal lines 140 are arranged along the first direction X; that is, the display region 100 includes multiple first power signal lines 110 arranged transversely and multiple second power signal lines 140 arranged longitudinally.

Specifically, the first power signal lines 110 and the second power signal lines 140 are located in different metal film layers of the display region 100, so that a tiled and non-interfering arrangement of the first power signal lines 110 and the second power signal lines 140 is ensured. Further, the first power signal lines 110 and the second power signal lines 140 are all used for transmitting power signals. The electrical connection between the first power signal lines 110 and the second power signal lines 140 in different film layers is achieved through existing via holes 150, so that the transmission loss of the power signals is reduced.

Further, referring to FIG. 1 and FIG. 2, first power signal lines 110 insulated from the first bus section 211 are electrically connected to the second power signal lines 140 through via holes 150. That is, first power signal lines 110 electrically connected to the first bus section 211 can acquire the power signal directly through the first bus section 211; and for first power signal lines 110 insulated from the first bus section 211, first power signal lines 110 having acquired the power signal transmit the acquired power signal to the second power signal lines 120 through via holes 150, and then the power signal is transmitted to the first power signal lines 110 insulated from the first bus section 211 through the second power signal lines 120 and the via holes 150. In this manner, on the basis that the balance of the power signals acquired in the entire display region 100 is ensured, each first power signal line 120 transmits the power signal, and a pixel circuit (not shown in the figures) electrically connected to each first power signal line 120 can receive the power signal and then generate a drive current to drive a light-emitting element to emit light, so that the overall display balance of the display panel 10 is ensured.

Exemplarily, referring to FIG. 1 and FIG. 2, only via holes 150 on one second power signal line 140 are shown, and via holes 150 on other second power signal lines 140 are not shown. Via holes 150 located in the first display region 120 can ensure that the first power signal lines 110 insulated from the first bus section 211 can acquire the power signal, and via holes 150 located in the second display region 130 can ensure that the power signal is transmitted to the second power signal lines 140 through the first power signal lines 110. The embodiment of the present disclosure does not specifically limit the number and positions of via holes 150.

Figure 6:
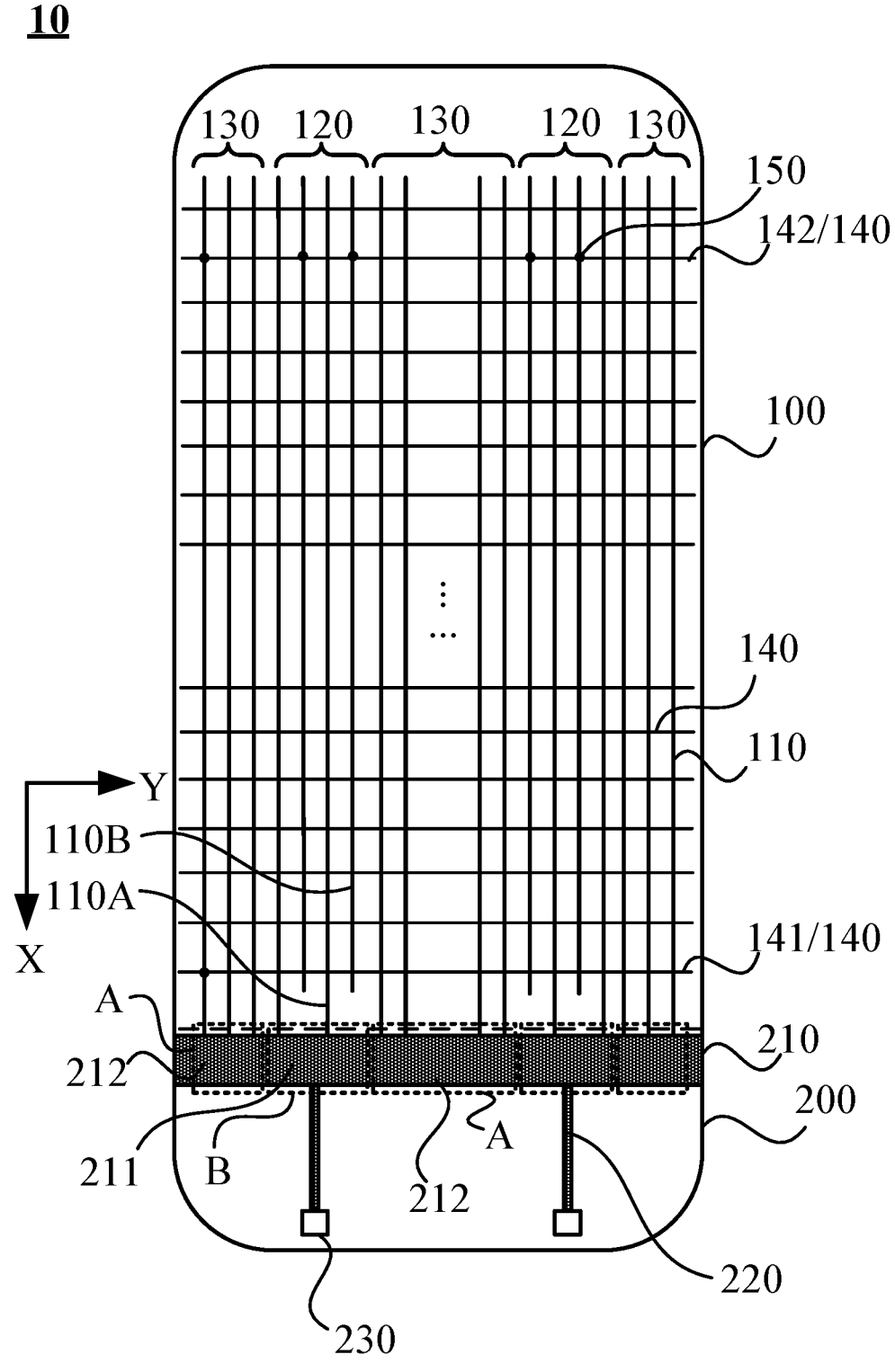
FIG. 6 is a structural diagram of another display panel according to an embodiment of the present disclosure.

FIG. 6 is a structural diagram of another display panel according to an embodiment of the present disclosure. Referring to FIG. 6, for two second power signal lines 140

(141 and 142) of the multiple second power signal lines 140, a second power signal line 140 of the two second power signal lines 140 which is close to a non-display region 200 side is insulated from the first power signal lines 110, and a second power signal line 140 of the two second power signal lines 140 which is away from the non-display region 200 side is electrically connected through via holes 150 to multiple first power signal lines 110 which are arranged along the second direction Y.

Referring to FIG. 6, the display region 100 includes multiple second power signal lines 140. In FIG. 6, the second power signal line 140 (141 in the figure) close to the non-display region 200 and the second power signal line 140 (142 in the figure) away from the non-display region 200 are taken as an example for illustration. Further, the first power signal lines 110 extend along the first direction X, that is, the first power signal lines 110 extend along the direction from which the display region 100 points to the non-display region 200. Since the resistance exists on the first power signal line 110, the loss of the power signal transmitted in a first power signal line 110 generated in the first power signal line 110 increases as the distance from the power signal to the non-display region 200 increases. Therefore, the strength of the power signal transmitted in the first power signal lines 110 close to the non-display region 200 needs to be higher than the strength of the power signal transmitted in the first power signal lines 110 away from the non-display region 200. Thus, in the embodiment of the present disclosure, the first power signal lines 110 close to the non-display region 200 side do not access the second power signal lines 140 in parallel through via holes 150, and the first power signal lines 110 away from the non-display region 200 side access the second power signal lines 140 in parallel through via holes 150. The second power signal lines 140 are disposed in parallel with the first power signal lines 110, so that the resistance on the power signal lines away from the non-display region 200 side is reduced, the transmission loss of the power signal in the first power signal lines 110 is compensated for, the difference between the power signal close to the non-display region 200 side and the power signal away from the non-display region 200 side is neutralized, the balance of the power signals in different regions of the display region 100 is ensured, and thus the display balance of the display panel is improved.

Figure 7:
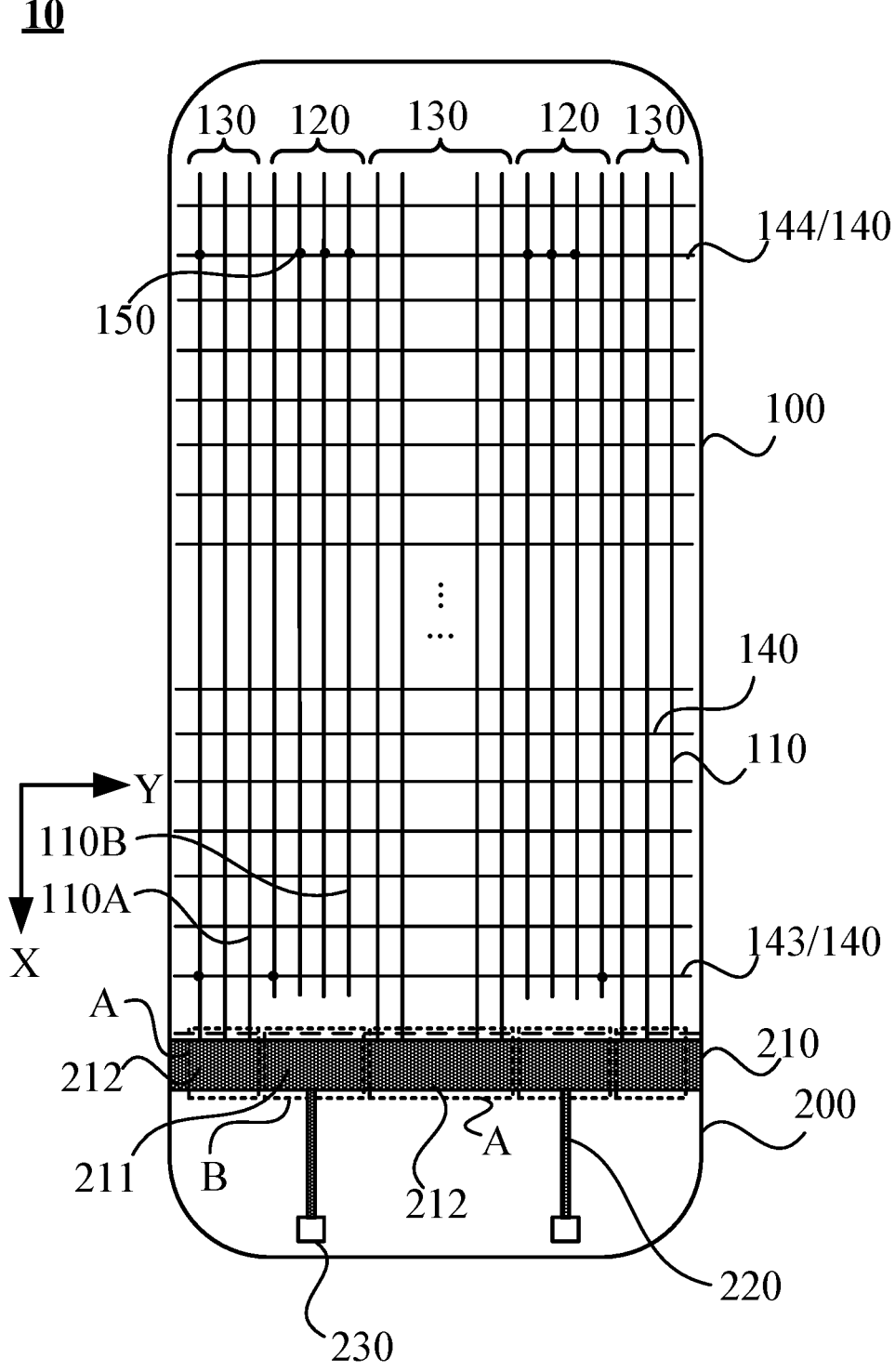
FIG. 7 is a structural diagram of another display panel according to an embodiment of the present disclosure.

FIG. 7 is a structural diagram of another display panel according to an embodiment of the present disclosure. Referring to FIG. 7, for two second power signal lines 140 of the multiple second power signal lines 140, the number of connection via holes 150 between a second power signal line 140 of the two second power signal lines 140 which is close to a non-display region 200 side and the multiple first power signal lines 110 which are arranged along the second direction Y is a third number, and the number of connection via holes 150 between a second power signal line 140 of the two second power signal lines 140 which is away from the non-display region 200 side and the multiple first power signal lines 110 which are arranged along the second direction Y is a fourth number, and the third number is smaller than the fourth number.

Referring to FIG. 7, the display region 100 includes multiple second power signal lines 140. In FIG. 7, the second power signal line 140 (143 in the figure) close to the non-display region 200 and the second power signal line 140 (144 in the figure) away from the non-display region 200 are taken as an example for illustration. Further, the first power signal lines 110 extend along the first direction X, that is, the first power signal lines 110 extend along the direction from which the display region 100 points to the non-display region 200. Since the resistance exists on the first power signal lines 110, the loss of the power signal transmitted in a first power signal line 110 generated in the first power signal line 110 increases as the distance from the power signal to the non-display region 200 increases. Therefore, the strength of the power signal transmitted in the first power signal lines 110 close to the non-display region 200 needs to be higher than the strength of the power signal transmitted in the first power signal lines 110 away from the non-display region 200. Thus, in the embodiment of the present disclosure, the number of connection via holes 150 between the second power signal line 140 which is close to the non-display region 200 side and the multiple first power signal lines 110 which are arranged along the second direction Y is smaller than the number of connection via holes 150 between the second power signal line 140 which is away from the non-display region 200 side and the multiple first power signal lines 110 which are arranged along the second direction Y, that is, the second power signal line 140 which is away from the non-display region 200 side is electrically connected to more first power signal lines 110 through via holes 150. In this manner, the resistance on the power signal line away from the non-display region 200 side is reduced, the difference in the transmission loss of the power signals in different regions of the display region is compensated for, the difference between the power signal close to the non-display region 200 side and the power signal away from the non-display region 200 side is neutralized, the balance of the power signals in different regions of the display region 100 is ensured, and thus the display balance of the display panel is improved.

Specifically, referring to FIG. 7, the second power signal line 140 (143 in FIG. 7) close to the non-display region 200 side is electrically connected to several first power signal lines 110 through the third number of vial holes 150, and in the figure, three via holes 150 are taken as an example; the second power signal line 140 (144 in FIG. 7) away from the non-display region 200 side is electrically connected to several first power signal lines 110 through the fourth number of vial holes 150, and in the figure, seven via holes 150 are taken as an example. The embodiment of the present disclosure does not specifically limit the number of via holes 150. The number of via holes 150 is adjusted, so that the loss of the power signal transmitted away from the non-display region 200 side can be further reduced, the display brightness difference of the display region 100 is balanced, and the balance of the display effect of the display panel 10 is further ensured.

Figure 8:
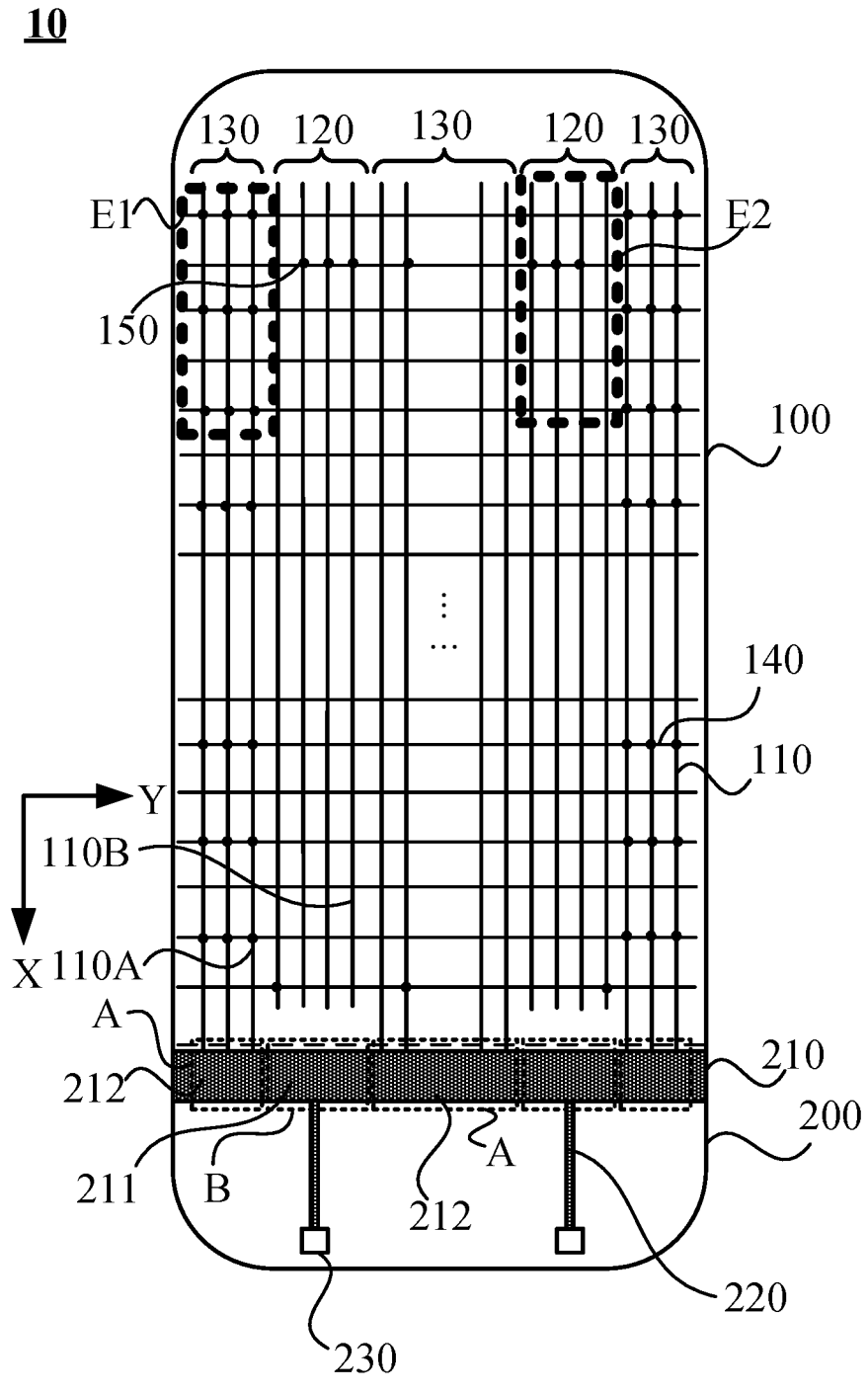
FIG. 8 is a structural diagram of another display panel according to an embodiment of the present disclosure.

FIG. 8 is a structural diagram of another display panel according to an embodiment of the present disclosure. Referring to FIG. 8, the first power signal lines 110 located in the first display region 120 are electrically connected to p second power signal lines 140, and p is a positive integer; the first power signal lines 110 located in the second display region 130 are electrically connected to q second power signal lines 140, and q is a positive integer; and p≤q.

Specifically, referring to FIG. 8, p via holes 150 exist on a first power signal line 110 in the first display region 120 for the first power signal line 110 to be electrically connected to p second power signal lines 140, and q via holes 150 exist on a first power signal line 110 in the second display region 130 for the first power signal line 110 to be electrically connected to q second power signal lines 140. p≤q, that is, the number of via holes 150 on the first power signal line 110 in the first display region 120 is smaller than or equal to the number of via holes 150 on the first power signal line 110 in the second display region 130. Then, the second power signal lines 140 are disposed in parallel with the first power signal line 110 so that the resistance on the power signal lines in the display region 100 is reduced. Specifically, the reduction degree of the resistance in the first display region 120 is less than the reduction degree of the resistance in the second display region 130, that is, the power signal with more transmission loss in the first power signal lines 110 in the second display region 130 is compensated for, so that the difference between the power signal of the first display region 120 and the power signal of the second display region 130 is neutralized, the balance of the power signals in different regions of the display region 100 is ensured, and thus the display balance of the display panel 10 is improved.

Exemplarily, referring to FIG. 8, one via hole 150 exists on a first power signal line 110 in region E2 in the first display region 120 for the first power signal line 110 to be electrically connected to one second power signal line 140, and three via holes 150 exist on a first power signal line 110 in region E1 in the second display region 130 for the first power signal line 110 to be electrically connected to three second power signal lines 140. Region E1 and region E2 have the same area, that is, the difference in numbers of via holes in different display regions having the same area is presented.

Figure 9:
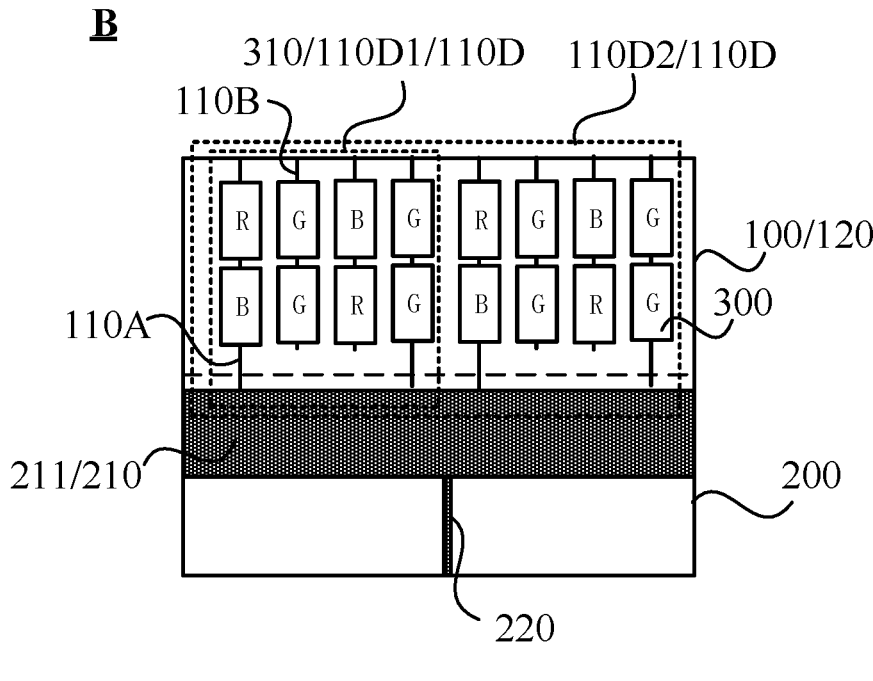
FIG. 9 is another enlarged diagram of region B in FIG. 1.

FIG. 9 is another enlarged diagram of region B in FIG. 1. Referring to FIG. 9, the display panel 10 further includes multiple subpixels 300 located in the display region 100, the multiple subpixels 300 are arranged in an array, and a first power signal line 110 is electrically connected to a column of subpixels 300 which are arranged along the first direction X. The first display region 120 includes multiple minimum subpixel repeating units 310, a minimum subpixel repeating unit 310 includes n columns of subpixels, and n is a positive integer. The first display region 120 includes multiple second power signal line groups 110D, and any two second power signal line groups 110D has the same connection condition between first power signal lines 110 and the first bus section 211; a second power signal line group 110D includes m first power signal lines, and m is a positive integer. m=k*n, and k is a positive integer.

The display panel 10 further includes multiple subpixels 300, and the subpixels 300 are electrically connected to the first power signal lines 110, so that the display light emission of the subpixels 300 is achieved, and thus the display function of the display panel 10 is achieved. Specifically, the subpixels 300 include red subpixels, green subpixels and blue subpixels, and thus the color display effect of the display panel 10 is achieved.

The minimum subpixel repeating unit 310 refers to a minimum repeating unit including multiple subpixels periodically arranged in a row or column form. Exemplarily, the minimum subpixel repeating unit 310 may include the red-green-blue-green (RGBG) arrangement, the delta arrangement, the diamond arrangement, etc., which is not specifically limited in the embodiment of the present disclosure. Further, the first display region 120 includes multiple minimum subpixel repeating units 310. Referring to FIG. 9, a minimum subpixel repeating unit 310 includes n columns of subpixels 300, and n being 4 is taken as an example for illustration. The embodiment of the present disclosure does not limit the specific value of n.

Further, the first display region 120 includes multiple second power signal line groups 110D, and any two second power signal line groups 110D has the same connection condition between first power signal lines 110 and the first bus section 211. That is, the first power signal lines 110 in the first display region 120 are regularly disposed with the first bus section 211. A second power signal line group 110D includes m first power signal lines 110, and the second power signal line group 110D may be disposed in multiple forms. Referring to FIG. 9, m in second power signal line group 110D1 may be 4, and m in second power signal line group 110D2 may be 8; the embodiment of the present disclosure does not limit the specific value of m. It is to be noted that in the first display region 120, the second power signal line group 110D is arranged in the form of second power signal line group 110D1 or in the form of second power signal line group 110D2, that is, in the first display region 120, second power signal line groups 110D are disposed in one form, and FIG. 9 only shows various forms that the second power signal line groups 110D may use through this figure. Moreover, m=k*n, and k is a positive integer, that is, the number of first power signal lines 110 in the second power signal line group 110D is an integer multiple of the number of first power signal lines 110 in a minimum subpixel repeating unit 310. If the second power signal line group 110 is set as second power signal line group 110D1 in FIG. 9, k=1; if the second power signal line group 110 is set as second power signal line group 110D1 in FIG. 9, k=2. The number of first power signal lines 110 in the second power signal line group 110D is set as an integer multiple of the number of first power signal lines 110 in each minimum subpixel repeating unit 310, so that the presented light emission effect is balanced, the display brightness of the display region 100 is balanced, and the balance of the display effect of the display panel 10 is further ensured.

Figure 10:
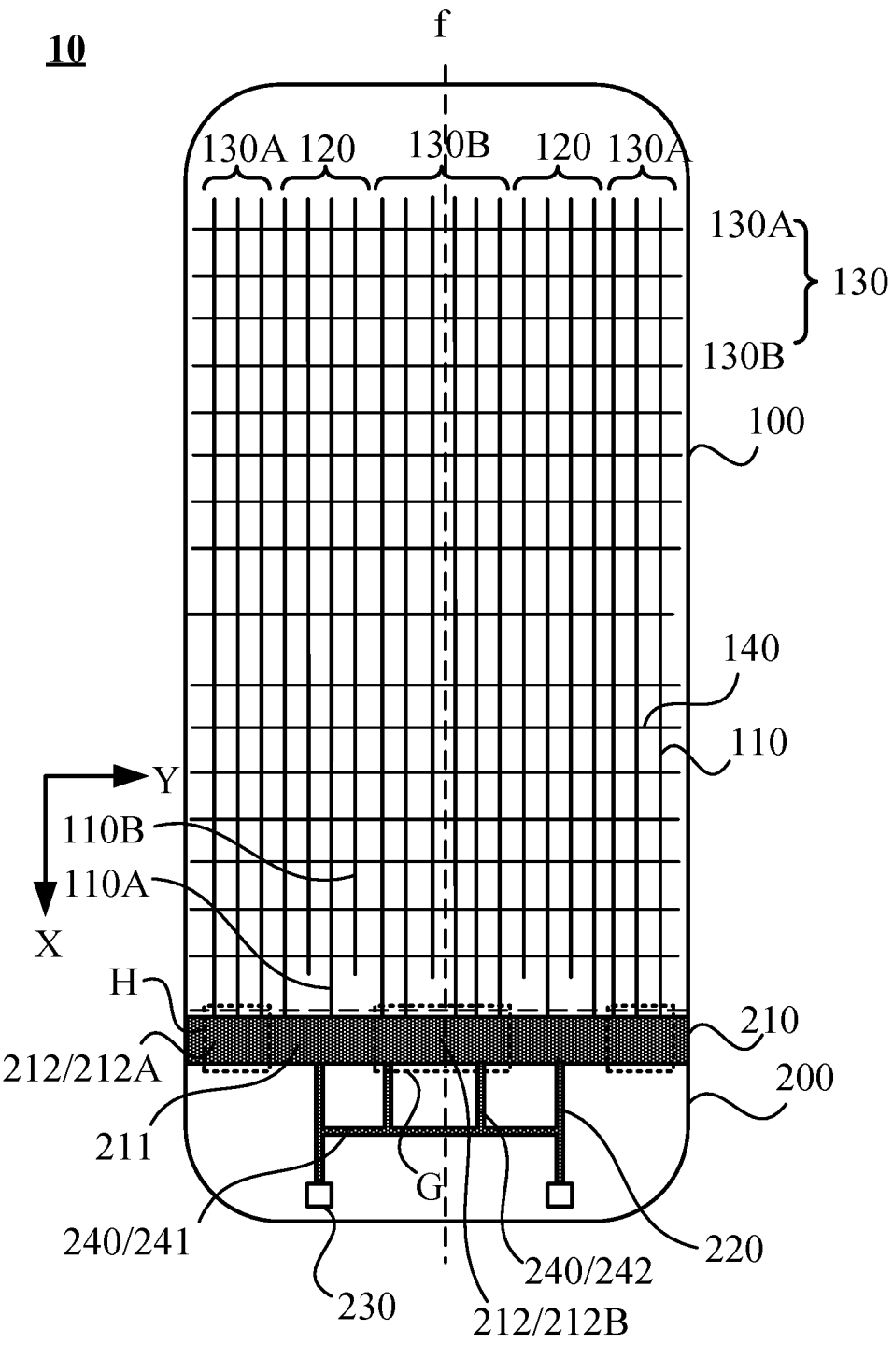
FIG. 10 is a structural diagram of another display panel according to an embodiment of the present disclosure.
Figure 11:
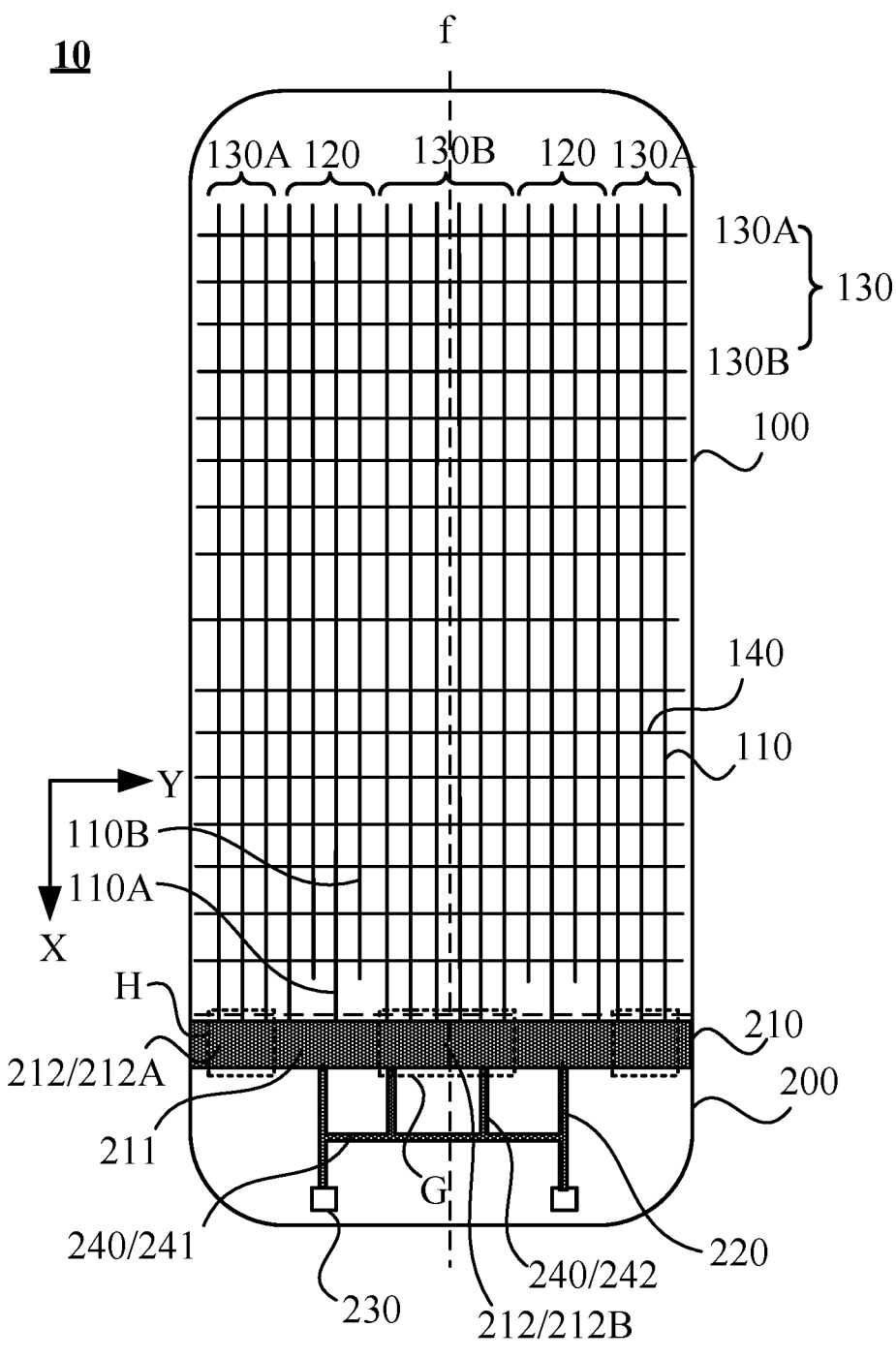
FIG. 11 is a structural diagram of another display panel according to an embodiment of the present disclosure.

FIG. 10 is a structural diagram of another display panel according to an embodiment of the present disclosure, and FIG. 11 is a structural diagram of another display panel according to an embodiment of the present disclosure. Referring to FIG. 10 and FIG. 11, the second bus section 212 includes first bus subsections 212A and a second bus subsection 212B, a first bus subsection 212A is located on a side of the first bus section 212 away from a center f of the display panel 10, and the second bus subsection 212B is located on a side of the first bus section 212 close to the center f of the display panel 10. The non-display region 200 further includes a power connecting line 240, the power connecting line 240 includes a first power connecting line 241 and second power connecting lines 242, the first power connecting line 241 is disposed in series between two power lead-out wires 220, and a second power connecting line 242 is disposed in series between the first power connecting line 241 and the second bus subsection 212B. The second display region 130 includes first display subregions 130A and a second display subregion 130B, a first display subregion 130A is located on a side of the first display region 120 away from the center f of the display panel 10, and the second display subregion 130B is located on a side of the first display region 120 close to the center f of the display panel 10. Along the first direction X, an overlapping region exists between a projection of a first display subregion 130A on the power bus 210 and a first bus subsection 212A, and an overlapping region exists between a projection of the second display subregion 130B on the power bus 210 and the second bus subsection 212B. First power signal lines 110 located in the first display subregion 130A are all electrically connected to the second bus subsection 212B, and first power signal lines 110 located in the second display subregion 130B are at least partially electrically connected to the first bus subsection 212A.

Referring to FIG. 10 and FIG. 11, the second bus section 212 includes the first bus subsections 212A and the second bus subsection 212B, and the first bus subsections 212A are further away from the center f of the display panel 10 than the second bus subsection 212B. Further, the non-display region 200 further includes the power connecting line 240. The first power connecting line 241 is disposed in series between two power lead-out wires 220, and the second power connecting line 242 is disposed in series between the first power connecting line 241 and the second bus subsection 212B. That is, the power signal transmitted by the power bus 210 is specifically transmitted to the second bus subsection 212B through the first power connecting line 241, and that is, the second bus subsection 212B is closer to the power lead-out wire 220 than the first bus subsection 212A. Therefore, the power loss of the power signal transmitted by the electrical connection between the first power signal lines 110 and the second bus subsection 212B is less than the power loss of the power signal transmitted by the electrical connection between the first power signal lines 110 and the first bus subsection 212A.

Further, the second display region 130 includes the first display subregions 130A and the second display subregion 130B, and the first display subregions 130A are further away from the center f of the display panel 10 than the second display subregion 130B. At the power bus 210, an overlapping region, that is, region H in FIG. 10 and FIG. 11, exists between the projection of the first display subregion 130A and the first bus subsection 212A, and first power signal lines 110 in the first display subregion 130A transmit the power signal through the first bus subsection 212A of region H. An overlapping region, that is, region G in FIG. 10 and FIG. 11, exists between the projection of the second display subregion 130B and the second bus subsection 212B, and first power signal lines 110 in the second display subregion 130B transmit the power signal through the second bus subsection 212B of region G. Moreover, the second bus subsection 212B in region G is closer to the power lead-out wire 220 than the first bus subsection 212A in region H, so that the power loss generated in the second bus subsection 212B is less than the power loss generated in the first bus subsection 212A. Multiple power buses 210 have different relative positions with the power lead-out wire 220, so that the power loss of power signals acquired by first power signal lines 110 at different positions is different, and thus the display balance of the display panel 10 is impacted.

Specifically, first power signal lines 110 located in the second display subregion 130B are at least partially electrically connected to the second bus subsection 212B, that is, referring to FIG. 10, the case may exist where part of the first power signal lines 110 in the second display subregion 130B are electrically connected to the second bus subsection 212B, and the other part of the first power signal lines 110 in the second display subregion 130B are not connected to, that is, are insulated from, the second bus subsection 212B. Referring to FIG. 11, the case may exist where all of the first power signal lines 110 in the second display subregion 130B are electrically connected to the second bus subsection 212B; simultaneously, first power signal lines 110 located in the first display subregion 130A are all electrically connected to the first bus subsection 212A. In other words, the position of the first bus subsection 211A relative to the power lead-out wire 220 is different from the position of the second bus subsection 212B relative to the power lead-out wire 220, and the first bus subsection 212A is further away from the power lead-out wire 220, so that the amount of power loss generated on the first power signal lines 110 is relatively large. The second bus subsection 212B may be insulated from part of the first power signal lines 110 to increase the loss of the power signal in the part of the first power signal lines, so that the loss balance of the power signals acquired by the first power signal lines 110 at different positions in the display region 100 is ensured, and thus the overall display balance of the display panel 10 is ensured.

With continued reference to FIG. 10 and FIG. 11, the first power signal lines 110 located in the second display subregion 130B are all electrically connected to the second bus subsection 212B; or the first power signal lines 110 located in the second display subregion 130B are partially electrically connected to the second bus subsection 212B.

Referring to FIG. 11, the first power signal lines 110 located in the second display subregion 130B are all electrically connected to the second bus subsection 212B, that is, the arrangement trend of the first power signal lines 110 in the first display subregion 130A is the same as the arrangement trend of the first power signal lines 110 in the second display subregion 130B. Alternatively, referring to FIG. 10, the first power signal lines 110 located in the second display subregion 130B are partially electrically connected to the second bus subsection 212B. That is, first power signal lines 110 insulated from the second bus subsection 212B exist in the second display subregion 130B, and that is, the arrangement trend of the first power signal lines 110 in the second display subregion 130B is the same as the arrangement trend of the first power signal lines 110 in the first display region 120. In other words, along the first direction X, the projection of the second display subregion 130B on the power bus 210 is closer to the power lead-out wire 220 than the projection of the first display subregion 130A on the power bus 210, while the projection of the first display region 120 on the power bus 210 is closer to the power lead-out wire 220 than the projection of the second display subregion 130B on the power bus 210. That is, the second display subregion 130B may be considered as an intermediate transition region, and therefore the arrangement trend of the first power signal lines 110 in the second display subregion 130B is the same as the arrangement trend of the first power signal lines 110 in the first display subregion 130A, or the arrangement trend of the first power signal lines 110 in the second display subregion 130B is the same as the arrangement trend of the first power signal lines 110 in the first display region 120, so that the display balance of the entire display panel 10 is achieved, which is not specifically limited in the embodiment of the present disclosure.

Figure 12:
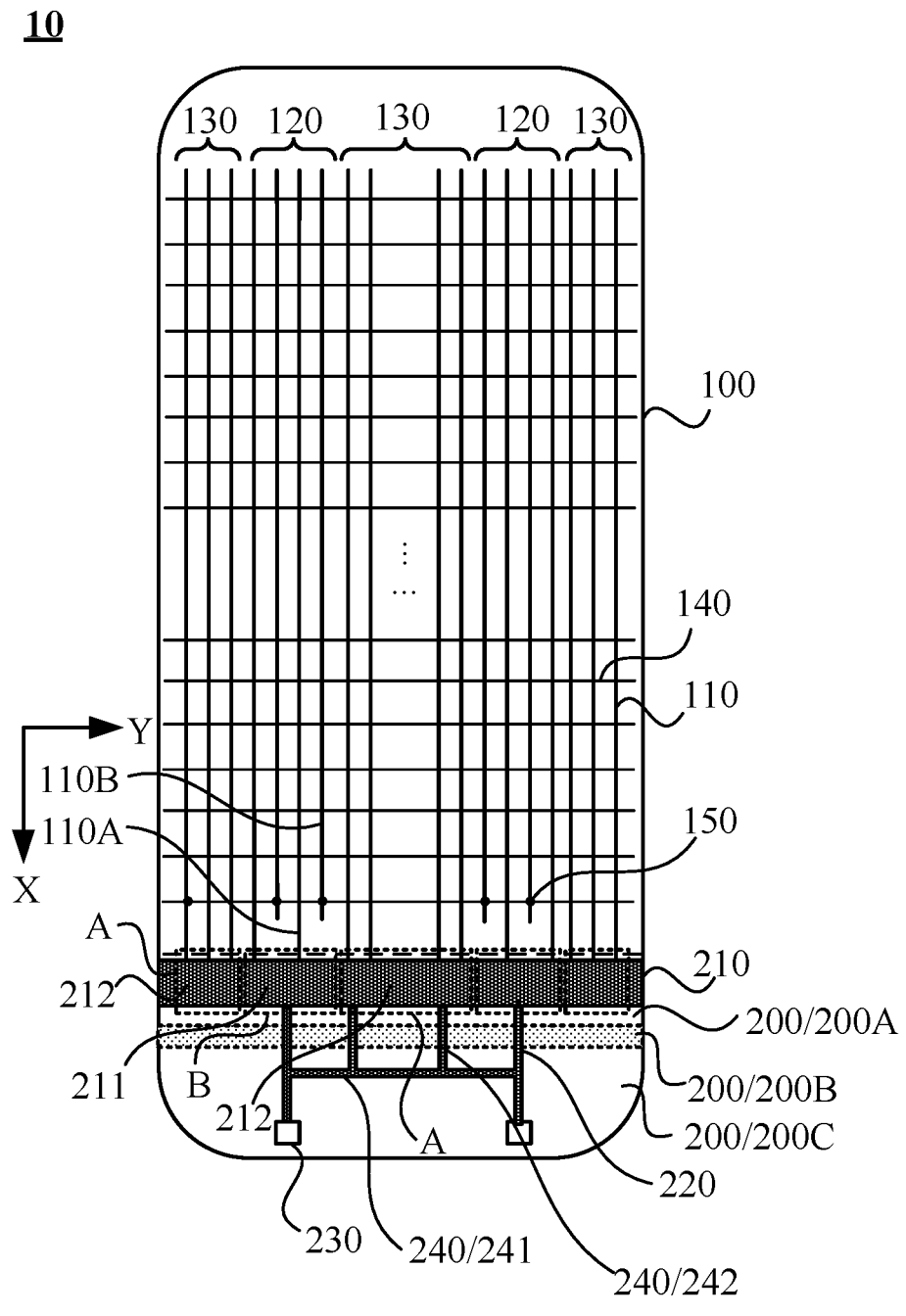
FIG. 12 is a structural diagram of another display panel according to an embodiment of the present disclosure.

FIG. 12 is a structural diagram of another display panel according to an embodiment of the present disclosure. Referring to FIG. 12, the non-display region 200 includes a first non-display region 200A, a foldable region 200B and a second non-display region 200C, the first non-display region 200A is located between the foldable region 200B and the display region 100, and the second non-display region 200C is located on a side of the foldable region 200B away from the display region 100. The power bus 210 is disposed in the first non-display region 200A, the first power connecting line 241 is disposed in the second non-display region 200C, and the power lead-out wire 220 and the second power connecting line 242 extend from the second non-display region 200C to the first non-display region 200A along the foldable region 200B.

The non-display region 200 includes the first non-display region 200A, the foldable region 200B and the second non-display region 200C. Through the foldable region 200B, part of wires and the like may be set on a non-light-emitting side of the display panel 10, so that the area occupied by the border of the display panel 10 is reduced, and a relativelylarge-area display effect of the display panel 10 is achieved. Further, referring to FIG. 12, through the foldable region 200B, the wire in the first non-display region 200A can be electrically connected to the wire in the second non-display region 200C, so that the transmission of signals in the display panel 10 is ensured.

Further, referring to FIG. 12, the first non-display region 200A is close to the display region 100; thus the power bus 210 is disposed in the first non-display region 200A, which facilitates the electric connection between the power bus 210 and the first power signal lines 110. The first power connecting line 241 is disposed in the second non-display region 200C, that is, the space occupied by the power connecting line 240 in the foldable region 200B is reduced, so that the folding effect of the foldable region 200B is facilitated. Moreover, the power lead-out wire 220 and the second power connecting line 242 extend from the second non-display region 200C to the first non-display region 200A along the foldable region 200B, so that the transmission of the power signal from the power signal terminal 230 to the first power signal lines 110 is ensured, the transmission of the signal is ensured, and thus the display effect of the display panel 10 is achieved.

Figure 13:
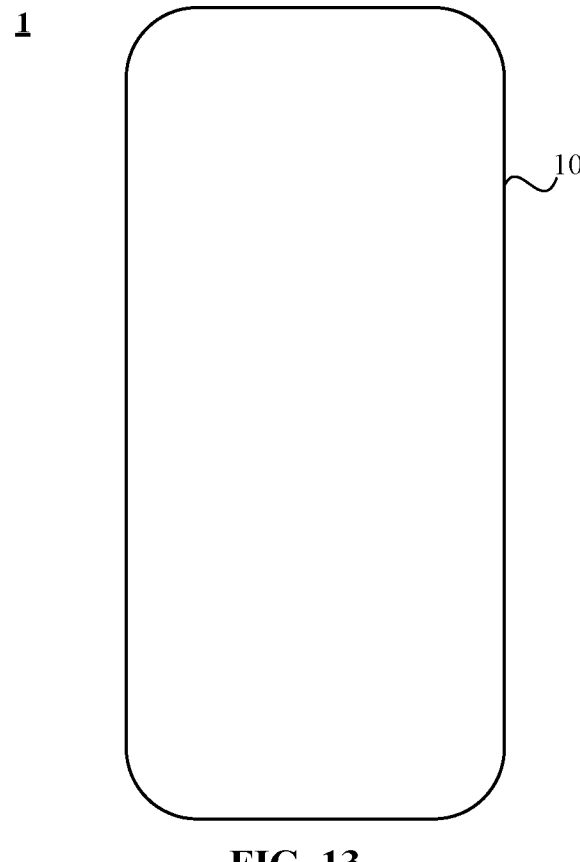
FIG. 13 is a structural diagram of a display device according to an embodiment of the present disclosure.

Based on the same concept, an embodiment of the present disclosure further provides a display device. FIG. 13 is a structural diagram of a display device according to an embodiment of the present disclosure. As shown in FIG. 13, the display device 1 includes the display panel 10 according to any of the preceding embodiments; therefore, the display device 1 provided in the embodiment of the present disclosure has the same beneficial effects as the preceding embodiments. Details are not described herein. Exemplarily, the display device 1 may be an electronic device such as a mobile phone, a computer, a smart wearable device (for example, a smart watch) and an onboard display device, which is not limited in the embodiment of the present disclosure.

It is to be noted that the preceding are only preferred embodiments of the present disclosure and the technical principles used therein. It is to be understood by those skilled in the art that the present disclosure is not limited to the embodiments described herein. For those skilled in the art, various apparent changes, readjustments and substitutions can be made without departing from the scope of the present disclosure. Therefore, while the present disclosure is described in detail through the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising a display region and a non-display region, wherein the non-display region is located on at least a side of the display region;

the display region comprises a plurality of first power signal lines, the plurality of first power signal lines extend along a first direction, the plurality of first power signal lines are arranged along a second direction, and the first direction and the second direction intersect;

the non-display region comprises a power bus and a power lead-out wire, and the power lead-out wire is disposed in series between the power bus and a power signal terminal;

the power bus comprises a first bus section and a second bus section, and along the first direction, the first bus section is connected to the power lead-out wire; and the display region comprises a first display region and a second display region, along the first direction, an overlapping region exists between a projection of the first display region on the power bus and the first bus section, an overlapping region exists between a projection of the second display region on the power bus and the second bus section, first power signal lines of the plurality of first power signal lines which are located in the first display region are not electrically connected to the first bus section or part of first power signal lines of the plurality of first power signal lines which are located in the first display region are electrically connected to the first bus section, and first power signal lines of the plurality of first power signal lines which are located in the second display region are electrically connected to the second bus section or part of first power signal lines of the plurality of first power signal lines which are located in the second display region are at least electrically connected to the second bus section.

2. The display panel according to claim 1, wherein part of the first power signal lines located in the first display region are electrically connected to the first bus section.

3. The display panel according to claim 2, wherein the first power signal lines located in the first display region comprise first power signal sublines electrically connected to the first bus section and second power signal sublines insulated from the first bus section; and a number of second power signal sublines between any two adjacent first power signal sublines is the same.

4. The display panel according to claim 2, wherein the first power signal lines located in the first display region comprise first power signal sublines electrically connected to the first bus section and second power signal sublines insulated from the first bus section;

two adjacent first power signal sublines and a second power signal subline between the two adjacent first power signal sublines form a first power signal line group; and at least two first power signal line groups have different numbers of second power signal sublines.

5. The display panel according to claim 4, wherein in any two first power signal line groups, a number of second power signal sublines in a first power signal line group of the any two first power signal line groups which is closer to a center side of the first display region is a first number, and a number of second power signal sublines in a first power signal line group of the any two first power signal line groups which is farther from the center side of the first display region is a second number; and the second number is smaller than the first number, and a center of the first display region extends along the first direction and coincides with a center of the power lead-out wire.

6. The display panel according to claim 1, wherein the first power signal lines located in the first display region are all insulated from the first bus section.

7. The display panel according to claim 1, wherein the display region further comprises a plurality of second power signal lines, the plurality of second power signal lines extend along the second direction, and the plurality of second power signal lines are arranged along the first direction;

The first power signal lines and the second power signal lines are disposed in different layers, and at least one second power signal line of the plurality of second power signal lines is electrically connected through via holes to the plurality of first power signal lines arranged along the second direction; and a first power signal line of the plurality of first power signal lines which is insulated from the first bus section is electrically connected through a via hole to a second power signal line of the plurality of second power signal lines.

8. The display panel according to claim 7, wherein for two second power signal lines of the plurality of second power signal lines, a second power signal line of the two second power signal lines which is closer to a non-display region side is insulated from the plurality of first power signal lines, and a second power signal line of the two second power signal lines which is farther from the non-display region side is electrically connected through via holes to the plurality of first power signal lines which are arranged along the second direction.

9. The display panel according to claim 7, wherein for two second power signal lines of the plurality of second power signal lines, a number of connection via holes between a second power signal line of the two second power signal lines which is closer to a non-display region side and the plurality of first power signal lines which are arranged along the second direction is a third number, and a number of connection via holes between a second power signal line of the two second power signal lines which is farther from the non-display region side and the plurality of first power signal lines which are arranged along the second direction is a fourth number, and the third number is smaller than the fourth number.

10. The display panel according to claim 7, wherein the first power signal lines located in the first display region are electrically connected to p second power signal lines of the plurality of second power signal lines, and p is a positive integer and p is less than a number of second power signal sublines in the display region;

the first power signal lines located in the second display region are electrically connected to q second power signal lines of the plurality of second power signal lines, and q is a positive integer and q is less than a number of second power signal sublines in the display region; and p≤q.

11. The display panel according to claim 2, wherein the display panel further comprises a plurality of subpixels located in the display region, the plurality of subpixels are arranged in an array, and a first power signal line of the plurality of first power signal lines is electrically connected to a column of subpixels of the plurality of subpixels which are arranged along the first direction;

the first display region comprises a plurality of minimum subpixel repeating units, a minimum subpixel repeating unit of the plurality of minimum subpixel repeating units comprises a plurality of columns of subpixels;

the first display region comprises a plurality of second power signal line groups, and any two second power signal line groups of the plurality of second power signal line groups have a same connection condition between first power signal lines and the first bus section; a second power signal line group of the plurality of second power signal line groups comprises a plurality of first power signal lines, and a number of the first power signal lines in a same second power signal line group is an integer multiple of a number of columns of the sub-pixels in a same minimum subpixel repeating units.

12. The display panel according to claim 1, wherein the second bus section comprises a first bus subsection and a second bus subsection, the first bus subsection is located on a side of the first bus section farther from a center of the display panel, and the second bus subsection is located on a side of the first bus section closer to the center of the display panel;

the non-display region further comprises a power connecting line, the power connecting line comprises a first power connecting line and a second power connecting line, the first power connecting line is disposed in series between two power lead-out wires, and the second power connecting line is disposed in series between the first power connecting line and the second bus subsection;

the second display region comprises a first display subregion and a second display subregion, the first display subregion is located on a side of the first display region farther from the center of the display panel, and the second display subregion is located on a side of the first display region closer to the center of the display panel;

along the first direction, a projection of the first display subregion on the power bus overlaps the first bus subsection, and a projection of the second display subregion on the power bus overlaps the second bus subsection; and first power signal lines located in the first display subregion are all electrically connected to the first bus subsection, and first power signal lines located in the second display subregion are at least partially electrically connected to the second bus subsection.

13. The display panel according to claim 12, wherein the first power signal lines located in the second display subregion are all electrically connected to the second bus subsection; or the first power signal lines located in the second display subregion are partially electrically connected to the second bus subsection.

14. The display panel according to claim 12, wherein the non-display region comprises a first non-display region, a foldable region and a second non-display region, the first non-display region is located between the foldable region and the display region, and the second non-display region is located on a side of the foldable region away from the display region; and the power bus is disposed in the first non-display region, the first power connecting line is disposed in the second non-display region, and the power lead-out wire and the second power connecting line extend from the second non-display region to the first non-display region along the foldable region.

15. A display device, comprising a display panel;

wherein the display panel comprises a display region and a non-display region, wherein the non-display region is located on at least a side of the display region;

the display region comprises a plurality of first power signal lines, the plurality of first power signal lines extend along a first direction, the plurality of first power signal lines are arranged along a second direction, and the first direction and the second direction intersect;

the non-display region comprises a power bus and a power lead-out wire, and the power lead-out wire is disposed in series between the power bus and a power signal terminal;

the power bus comprises a first bus section and a second bus section, and along the first direction, the first bus section is connected to the power lead-out wire; and the display region comprises a first display region and a second display region, along the first direction, an overlapping region exists between a projection of the first display region on the power bus and the first bus section, an overlapping region exists between a projection of the second display region on the power bus and the second bus section, first power signal lines of the plurality of first power signal lines which are located in the first display region are not electrically connected to the first bus section or part of first power signal lines of the plurality of first power signal lines which are located in the first display region are electrically connected to the first bus section, and first power signal lines of the plurality of first power signal lines which are located in the second display region are electrically connected to the second bus section or part of first power signal lines of the plurality of first power signal lines which are located in the second display region are electrically connected to the second bus section.

16. The display device according to claim 15, wherein part of the first power signal lines located in the first display region are electrically connected to the first bus section.

17. The display device according to claim 16, wherein the first power signal lines located in the first display region comprise first power signal sublines electrically connected to the first bus section and second power signal sublines insulated from the first bus section; and a number of second power signal sublines between any two adjacent first power signal sublines is the same.

18. The display device according to claim 16, wherein the first power signal lines located in the first display region comprise first power signal sublines electrically connected to the first bus section and second power signal sublines insulated from the first bus section;

two adjacent first power signal sublines and a second power signal subline between the two adjacent first power signal sublines form a first power signal line group; and two first power signal line groups have different numbers of second power signal sublines.

19. The display device according to claim 18, wherein in any two first power signal line groups, a number of second power signal sublines in a first power signal line group of the any two first power signal line groups which is closer to a center side of the first display region is a first number, and a number of second power signal sublines in a first power signal line group of the any two first power signal line groups which is farther from the center side of the first display region is a second number; and the second number is smaller than the first number, and a center of the first display region extends along the first direction and coincides with a center of the power lead-out wire.

20. The display device according to claim 15, wherein the first power signal lines located in the first display region are all insulated from the first bus section.

* * * * *